US012568700B2

(12) United States Patent
Tsai et al.

(10) Patent No.: US 12,568,700 B2
(45) Date of Patent: Mar. 3, 2026

(54) METHOD FOR FORMING ISOLATION STRUCTURE AND SEMICONDUCTOR STRUCTURE

(71) Applicant: TAIWAN SEMICONDUCTOR MANUFACTURING COMPANY LTD., Hsinchu (TW)

(72) Inventors: Tzung-Yi Tsai, Taoyuan City (TW); Kuo-Yu Wu, Hsinchu County (TW); Tse-Hua Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 301 days.

(21) Appl. No.: 18/503,143

(22) Filed: Nov. 6, 2023

(65) Prior Publication Data

US 2024/0072079 A1    Feb. 29, 2024

Related U.S. Application Data

(62) Division of application No. 17/206,572, filed on Mar. 19, 2021, now Pat. No. 11,848,339.

(51) Int. Cl.
  *H10F 39/00*    (2025.01)
  *H01L 21/762*    (2006.01)
  *H10F 39/18*    (2025.01)

(52) U.S. Cl.
  CPC ..... *H10F 39/803* (2025.01); *H01L 21/76224* (2013.01)

(58) Field of Classification Search
  CPC .......................... H10F 39/803; H01L 21/76224
  See application file for complete search history.

(56) References Cited

U.S. PATENT DOCUMENTS

| | | | | | |
|---|---|---|---|---|---|
| 5,989,978 | A | * | 11/1999 | Peidous | H01L 21/763 |
| | | | | | 257/E21.549 |
| 6,187,649 | B1 | * | 2/2001 | Gau | H01L 21/76224 |
| | | | | | 257/E21.546 |
| 6,251,748 | B1 | * | 6/2001 | Tsai | H01L 21/76229 |
| | | | | | 438/762 |
| 6,451,654 | B1 | * | 9/2002 | Lin | H10B 41/30 |
| | | | | | 438/296 |
| 7,148,117 | B2 | * | 12/2006 | Seo | H01L 21/76232 |
| | | | | | 257/E21.549 |

(Continued)

FOREIGN PATENT DOCUMENTS

| | | |
|---|---|---|
| CN | 1622310 A | 6/2005 |
| CN | 104350603 A | 2/2015 |

OTHER PUBLICATIONS

U.S. Pat. No. 7528052 B2 is the US counterpart application of CN 1622310A.
English Abstract of CN 104350603 A.

*Primary Examiner* — Mohsen Ahmadi
(74) *Attorney, Agent, or Firm* — WPAT LAW; Anthony King

(57) ABSTRACT

A method for forming an isolation structure includes following operations. A trench is formed in a semiconductor substrate. A first insulating layer covering a bottom and sidewalls of the trench is formed. A charge-trapping layer is formed on the first insulating layer. The trench is filled with a second insulating layer. The charge-trapping layer include a material different from those of the first insulating layer and the second insulating layer.

17 Claims, 11 Drawing Sheets

202

(56) References Cited

U.S. PATENT DOCUMENTS

| | | | | |
|---|---|---|---|---|
| 7,160,787 | B2 * | 1/2007 | Heo | H01L 21/76229<br>438/428 |
| 7,968,407 | B2 * | 6/2011 | Fayrushin | H10B 69/00<br>438/142 |
| 8,329,545 | B1 | 12/2012 | Meotto et al. | |
| 9,508,769 | B1 * | 11/2016 | Li | H10F 39/8053 |
| 10,115,758 | B2 * | 10/2018 | Chen | H10F 39/024 |
| 10,796,943 | B2 * | 10/2020 | Ye | H01L 21/76237 |
| 2002/0055236 | A1 * | 5/2002 | Chen | H01L 21/76237<br>438/440 |
| 2003/0181049 | A1 * | 9/2003 | Huang | H01L 21/764<br>257/E21.573 |
| 2004/0126990 | A1 * | 7/2004 | Ohta | H10D 84/038<br>257/E21.546 |
| 2006/0199352 | A1 * | 9/2006 | Huang | H01L 21/76224<br>257/E21.546 |
| 2007/0205489 | A1 * | 9/2007 | Tilke | H01L 21/76229<br>257/E21.549 |
| 2008/0280418 | A1 * | 11/2008 | Wang | H01L 21/76224<br>257/E21.53 |
| 2009/0203189 | A1 | 8/2009 | Shin et al. | |
| 2010/0237432 | A1 * | 9/2010 | Takeoka | H01L 21/76237<br>257/E21.546 |
| 2013/0082231 | A1 * | 4/2013 | Tada | G11C 13/0007<br>257/4 |
| 2014/0051227 | A1 * | 2/2014 | Jakubowski | H01L 21/31116<br>257/E21.546 |
| 2016/0126250 | A1 | 5/2016 | Chang et al. | |
| 2018/0269237 | A1 * | 9/2018 | Cheng | H10F 39/8063 |
| 2019/0355682 | A1 * | 11/2019 | Sugioka | G03F 1/54 |
| 2020/0144102 | A1 * | 5/2020 | Ye | H01L 21/30604 |
| 2021/0066225 | A1 * | 3/2021 | Chou | H10F 39/807 |
| 2021/0343838 | A1 * | 11/2021 | Chou | H10D 62/115 |
| 2022/0208760 | A1 * | 6/2022 | Hsiung | H10D 84/859 |

* cited by examiner

METHOD FOR FORMING ISOLATION STRUCTURE AND SEMICONDUCTOR STRUCTURE

PRIORITY CLAIM AND CROSS-REFERENCE

This patent is a divisional application of U.S. patent application Ser. No. 17/206,572 filed on Mar. 19, 2021, entitled of "SEMICONDUCTOR STRUCTURE INCLUDING ISOLATION STRUCTURE AND METHOD FOR FORMING ISOLATION STRUCTURE", which is incorporated by reference in its entirety.

BACKGROUND

In the integrated circuit industry today, hundreds of thousands of semiconductor devices are built on a single chip. A device on the chip may be electrically isolated to ensure that it operates independently without interfering with another device. The art of isolating semiconductor devices has become an important aspect of modern semiconductor technology for the separation of different devices or different functional regions. With the high degree of integration of the semiconductor devices, improper electrical isolation of devices can cause current leakage, which can result in loos of a significant amount of power as well as compromise functionality. Some examples of reduced functionality include latch-up, which temporarily or permanently damage the circuit, noise margin degradation, voltage shift, and cross-talk.

Shallow trench isolation (or, simply, isolation) is an electrical isolation techniques, especially for semiconductor chips with a high degree of integration. In general, isolation techniques involve the formation of shallow trenches in the isolation areas or regions of a semiconductor wafer. The shallow trenches are then filled with dielectric material such as silicon dioxide to provide electrical isolation between devices that are subsequently formed in the active regions on either side of the filled trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 8 are schematic drawings illustrating a semiconductor structure including an isolation structure at various fabrication stages constructed according to aspects of the present disclosure in one or more embodiments, wherein

DETAILED DESCRIPTION

Figure 1:
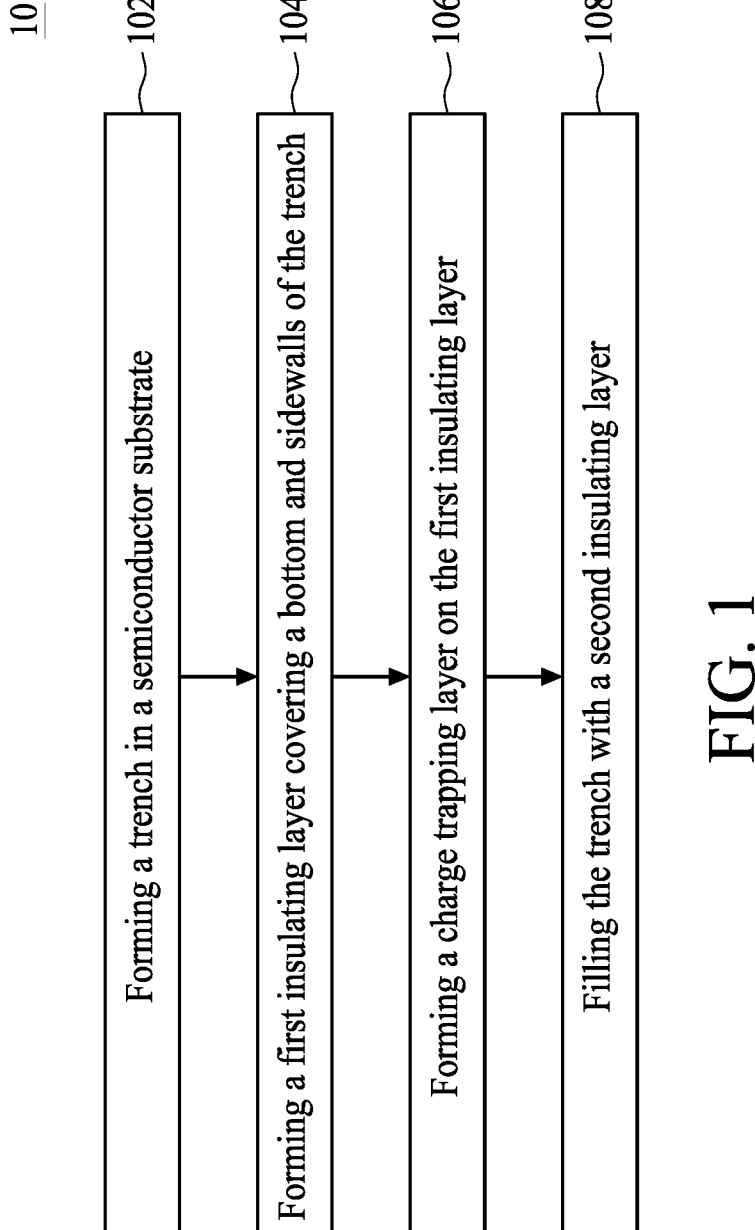
FIG. 1 is a flowchart representing a method for forming an isolation structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

While recent reductions in scale of complementary metal-oxide semiconductor (CMOS) have enabled circuit and system designers to pack a tremendous amount of functionality onto a silicon die, such down-scaling has simultaneously created a number of significant problems in the chip's ability to interface with the outside world. For example, an ion implantation and an anneal may be required to form a doped region surrounding an isolation structure in a sensor array region. This doped region is provided to reduce electron leakage between adjacent pixels or image sensors. However, such doped region is not required in a peripheral region. Therefore, a protecting mask and a photolithography operation are further required to protect the peripheral region after forming trenches in both the sensor array region and the peripheral region. The ion implantation is performed on a portion of a substrate exposed through the trench in the sensor array region, prior to filling the trench with a dielectric material. Thus, the ion implantation may damage the substrate. In some comparative approaches, defect may be induced in the substrate, and electron leakage is undesirably increased.

The present disclosure therefore provides a method for forming an isolation structure that is able to mitigate the above-mentioned issues. In some embodiments, the present disclosure provides a method for forming a semiconductor structure including an isolation that is able to reduce a need to use the protecting mask and perform the photolithography operation. Further, the method replaces the doped region with a charge-trapping layer, thereby eliminating the need to perform the ion implantation used to form the doped region, such that a defect issue and a leakage issue caused by the ion implantation can be mitigated.

FIG. 1 is a flow chart representing a method for forming an isolation structure 10 according to aspects of the present disclosure. The method for forming the isolation structure 10 includes a number of operations (102, 104, 106 and 108) and is further described below according to one or more embodiments. It should be noted that the operations of the method 10 may be omitted, rearranged or otherwise modified within the scope of the various aspects. It should further be noted that additional operations may be provided before, during, and after the method 10, and that some other operations may be only briefly described herein. Thus other implementations are possible within the scope of the various aspects described herein.

Figure 2:
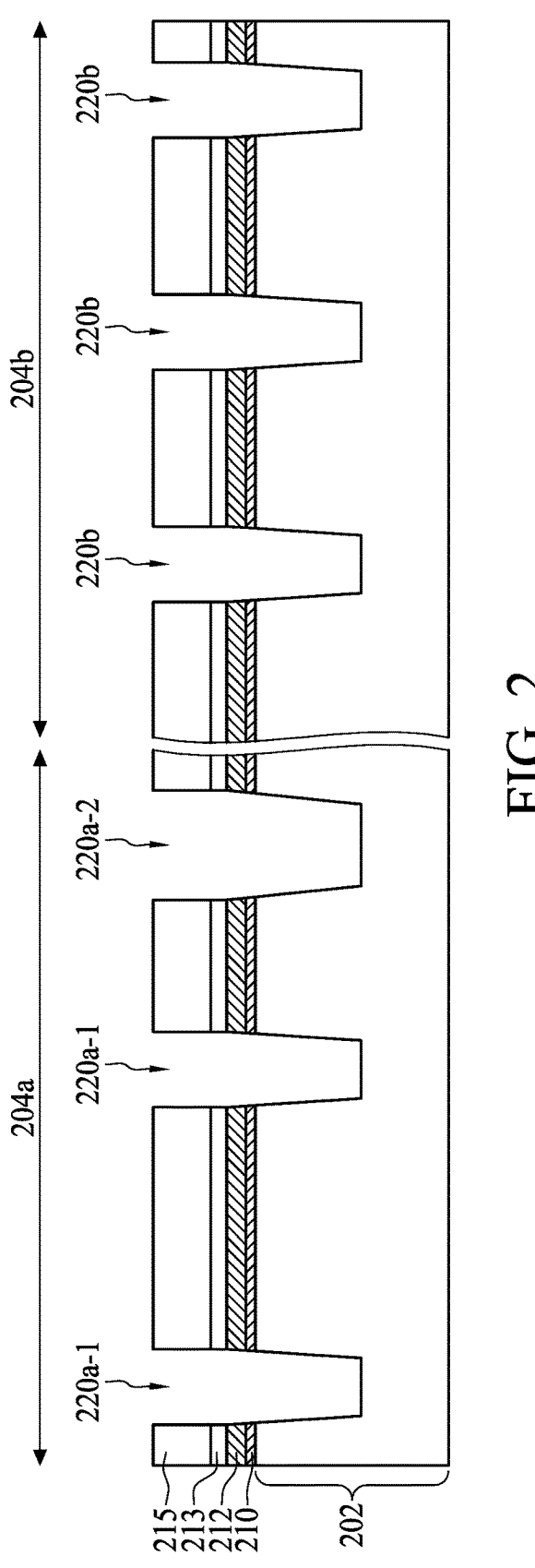

FIGS. 2 to 8 are schematic drawings illustrating a semiconductor structure 200 including an isolation structure at various fabrication stages constructed according to aspects of the present disclosure in one or more embodiments. In some embodiments, in operation 102, the method 10 includes forming a trench 220a, 220b in a semiconductor substrate 202. Referring to FIG. 2, in some embodiments, the semiconductor substrate 202 is received or provided. In some embodiments, the semiconductor substrate 202 includes silicon (Si). In some embodiments, other commonly used materials, such as carbon (C), germanium (Ge), gallium (Ga), arsenic (As), nitrogen (N), indium (In), phosphorus (P), and the like, may also be included in the semiconductor substrate 202. Compound materials used for semiconductor substrate such as SiGe, SiC, GaAs, InAs, or InP, and combinations thereof, may be used. In some embodiments, the semiconductor substrate 202 may include a silicon-on-insulator (SOI) substrate.

In some embodiments, the semiconductor structure 200 may be integrated with image sensor devices. In such embodiments, the semiconductor substrate 202 has a sensor array region 204a and a peripheral region 204b defined thereon, as shown in FIG. 2. The sensor array region 204a is used to accommodate image sensors and associated transistor(s) for receiving signals proportional to the intensity of light received by the image sensor during a light-sampling interval. The peripheral region 204b is used to accommodate devices used to form circuitry for providing functions other than that of the image sensors, such as input/output buffers and logic circuitry. This circuitry may include logic circuitry for operating the images sensors and circuitry for transmitting data corresponding to the sensed light to external devices. In some embodiments, the peripheral region 204b may be positioned adjacent to the sensor array region 204a.

Still referring to FIG. 2, in some embodiments, a pad layer 210 and a hard mask layer 212 may be formed over a top surface of the semiconductor substrate 202. In some embodiments, the pad layer 210 may be a thin film including silicon oxide formed, for example, using a thermal oxidation process. The pad layer 210 may act as an adhesion layer between the semiconductor substrate 202 and the hard mask layer 212. The pad layer 210 may also act as an etch stop layer for etching the hard mask layer 212 and a buffering layer to reduce stress caused by the hard mask layer 212. In some embodiments, the hard mask layer 212 may include silicon nitride (SiN), but the disclosure is not limited thereto. In some embodiments, a silicon-rich oxide (SRO) layer 213 and a patterned photoresist 215 may be formed on the hard mask layer 212. The patterned photoresist 215 may have openings defining locations and dimensions of isolation structures to be formed.

In some embodiments, the SRO layer 213 and the hard mask layer 212 are patterned through the patterned photoresist 215, such that the openings are transferred to the SRO layer 213 and the hard mask layer 212. Consequently, a patterned SRO layer 213 and a patterned hard mask layer 212 are formed. In some embodiments, subsequently, the pad layer 210 and the semiconductor substrate 202 are etched through the patterned SRO layer 213 and the patterned hard mask layer 212. Consequently, at least a trench is formed in the substrate 202. In such embodiments, a plurality of trenches 220a-1, 220a-2 and 220b are formed. Additionally, the trenches 220a-1, 220a-2 in the sensor array region 204a and the trenches 220b in the peripheral region 204b can each be formed in as large a quantity as needed.

In some embodiments, the trenches 220a-1 and 220a-2 are formed in the sensor array region 204a, and the trenches 220b are formed in the peripheral region 204b, as shown in FIG. 2. In some embodiments, the trenches 220a-1, 220a-2 and 220b may include a same depth. For example, the depth of the trenches 220a-1, 220a-2 and 220b may be between approximately 1500 angstroms and 2500 angstroms, but the disclosure is not limited thereto. In some embodiments, widths of the trenches 220a-1, 220a-2 and 220b may be between approximately 700 angstroms and 5000 angstroms, but the disclosure is not limited thereto. In some embodiments, the width of the trench 220a-1 in the sensor array region 204a and the width of the trench 220b in the peripheral region 204b are similar. In some embodiments, the width of the trench 220a-2 in the sensor array region 204a and the width of the trench 220b in the peripheral region 204b are different. For example, the width of the trench 220a-2 is greater than the width of the trench 220b. In some embodiments, the patterned photoresist 215 and the patterned SRO layer 213 may be removed after the forming of the trenches 220a-1, 220a-2 and 220b.

Figure 3A:
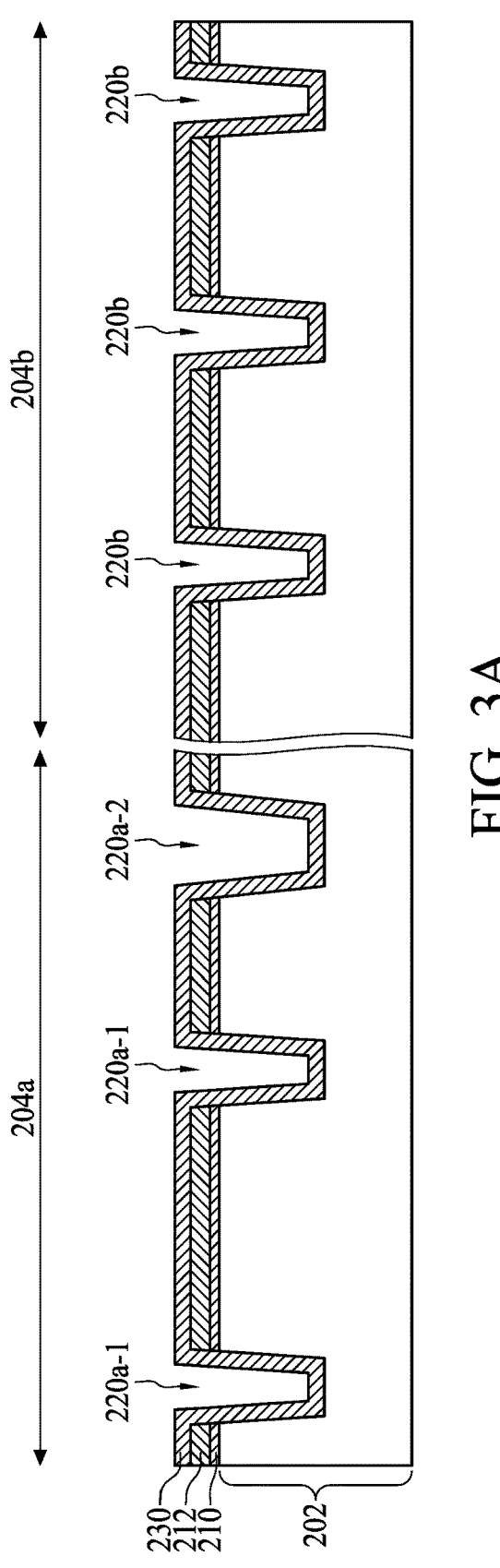
FIGS. 3A and 3B are schematic drawings illustrating a semiconductor structure according to different embodiments.

In some embodiments, in operation 104, the method 10 includes forming a first insulating layer 230 covering bottoms and sidewalls of the trenches 220a-1, 220a-2 and 220b. In some embodiments, the first insulating layer 230 includes silicon oxide ($SiO_x$), but the disclosure is not limited thereto. Accordingly, in some embodiments, the first insulating layer 230 may be referred to as a first oxide layer. Referring to FIG. 3A, in some embodiments, the first insulating layer 230 may be formed by a deposition operation. For example, the first insulating layer 230 may be formed by a chemical vapor deposition (CVD), atomic layer deposition (ALD), high-density plasma CVD (HDP-CVD), physical vapor deposition (PVD), or other suitable depositions. A thickness of the first insulating layer 230 may be between approximately 10 angstroms and 100 angstroms, but the disclosure is not limited thereto. In such embodiments, the first insulating layer 230 may cover not only the bottom and sidewalls of each trench 220a-1, 220a-2, 220b, but also a top surface of the patterned hard mask layer 212, as shown in FIG. 3A.

Figure 3B:
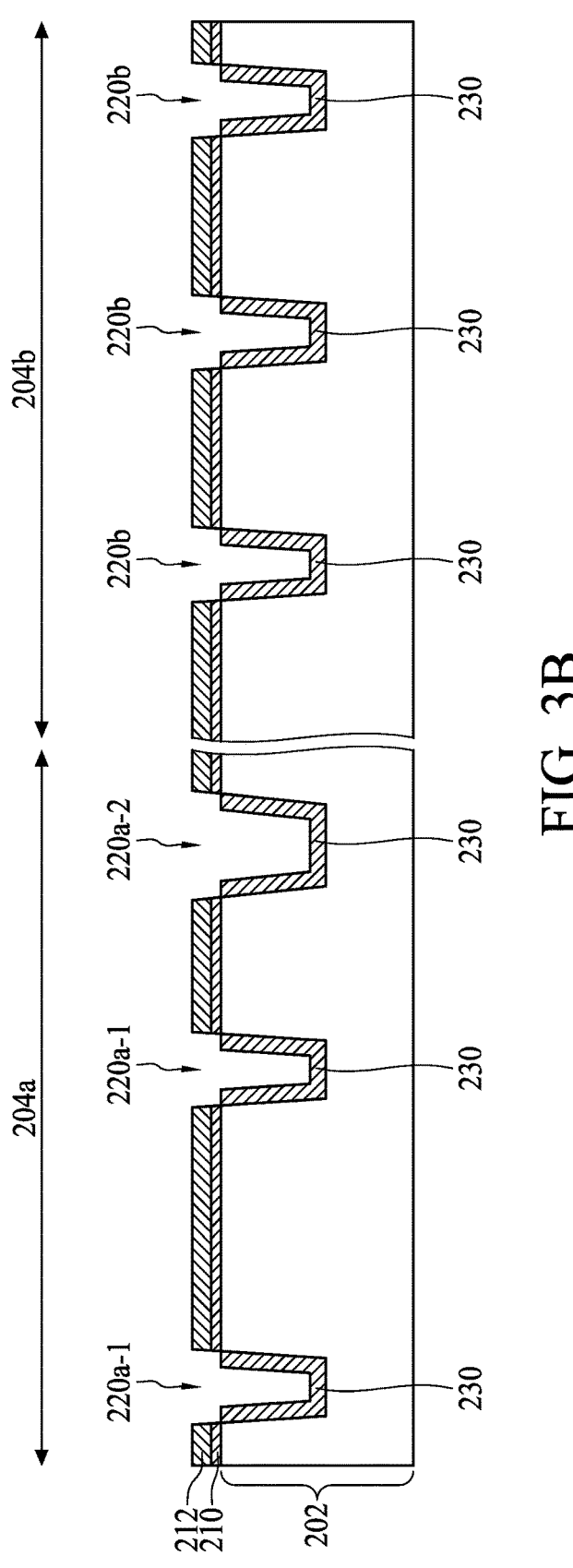

In some embodiments, the first insulating layer 230 (i.e., the first oxide layer) 230 may be formed by a thermal oxidation, a rapid-thermal oxidation, or other suitable oxidations. In an exemplary embodiment, the first insulating layer 230 may be formed using a dry thermal oxidation operation performed at a temperature greater than 1000° C. and in an oxygen with a process duration between approximately 1 hour and approximately 2 hours, but the disclosure is not limited thereto. In such embodiments, the first insulating layer 230 may be formed over a portion of the semiconductor substrate 202 exposed through the bottoms and sidewalls of the trenches 220a-1, 220a-2, 220b. Therefore, the top surface of the patterned hard mask layer 212 is free of the first insulating layer 230, as shown in FIG. 3B.

The first insulating layer 230 serves several purposes. In some embodiments, the oxidation for forming the first insulating layer 230 may repair etching-caused damages to the bottoms and sidewalls of the trenches 220a-1, 220a-2, 220b by consuming a small amount of substrate material exposed through the bottoms and sidewalls of the trenches 220a-1, 220a-2, 220b. In some embodiments, the oxidation for forming the first insulating layer 230 may round upper corners of the trenches 220a-1, 220a-2, 220b thereby minimizing the fringing fields that can result from sharp corners at the active area edge. In some comparative approaches, such fields may form a parasitic, low-threshold voltage transistor at the active area edge and thus degrade the subthreshold characteristics of the main device.

In some embodiments, the first insulating layer 230 (i.e., the first oxide layer), regardless of formation methods, helps to reduce crystalline defects at an interface between the semiconductor substrate 202 and a subsequently formed material. Interface traps, i.e., electrically-active defects at an oxide/semiconductor interface, are thereby minimized. In other words, the first insulating layer 230 may provide a high-quality interface between the bottoms and sidewalls of the trenches 220a-1, 220a-2, 220b and the subsequently-formed layer.

Please refer to FIGS. 4 to 8. It should be noted that although the semiconductor structure shown in FIGS. 4 to 8 is at various stages subsequent to that shown in FIG. 3A, the same operations can be performed on the semiconductor structure shown in FIG. 3B; therefore, repeated descriptions of details are omitted for brevity.

Figure 4:
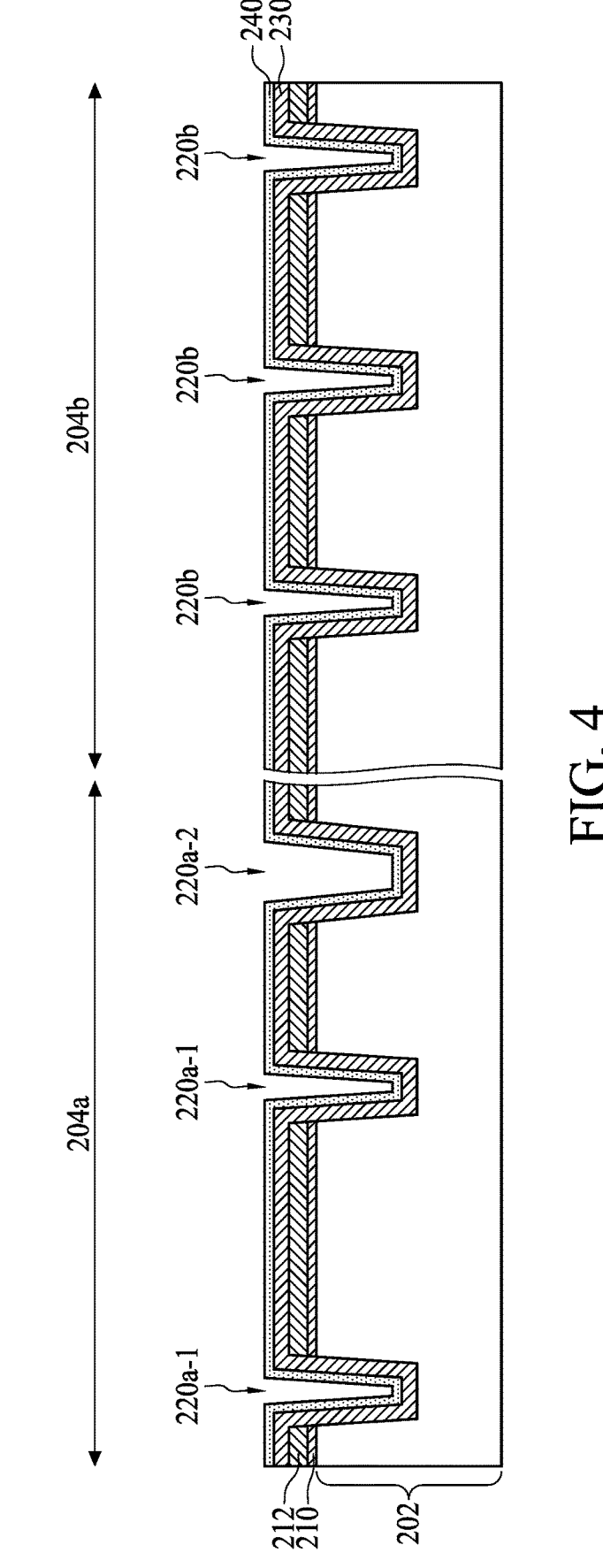

Referring to FIG. 4, in some embodiments, in operation 106, the method 10 includes forming a charge-trapping layer 240 on the first insulating layer 230. The charge-trapping layer 240 includes a material different from that of the first insulating layer 230. In some embodiments, the charge-trapping layer 240 may include a silicon nitride (x), but the disclosure is not limited thereto. As shown in FIG. 4, the charge-trapping layer 240 is separated from the substrate material exposed through the bottoms and sidewalls of the trenches 220a-1, 220a-2, 220b by the first insulating layer 230. In some embodiments, a thickness of the charge-trapping layer 240 is less than the thickness of the first insulating layer 230. In some embodiments, the thickness of the charge-trapping layer 240 is between approximately 10 angstroms and 40 angstroms, but the disclosure is not limited thereto. In some comparative approaches, when the thickness of the charge-trapping layer 240 is less than approximately 10 angstroms, an insufficient quantity of positive fixed charges may be provided. In some alternative comparative approaches, when the thickness of the charge-trapping layer 240 is greater than 40 angstroms, unwanted stress may be introduced on the semiconductor substrate 202.

Figure 5:
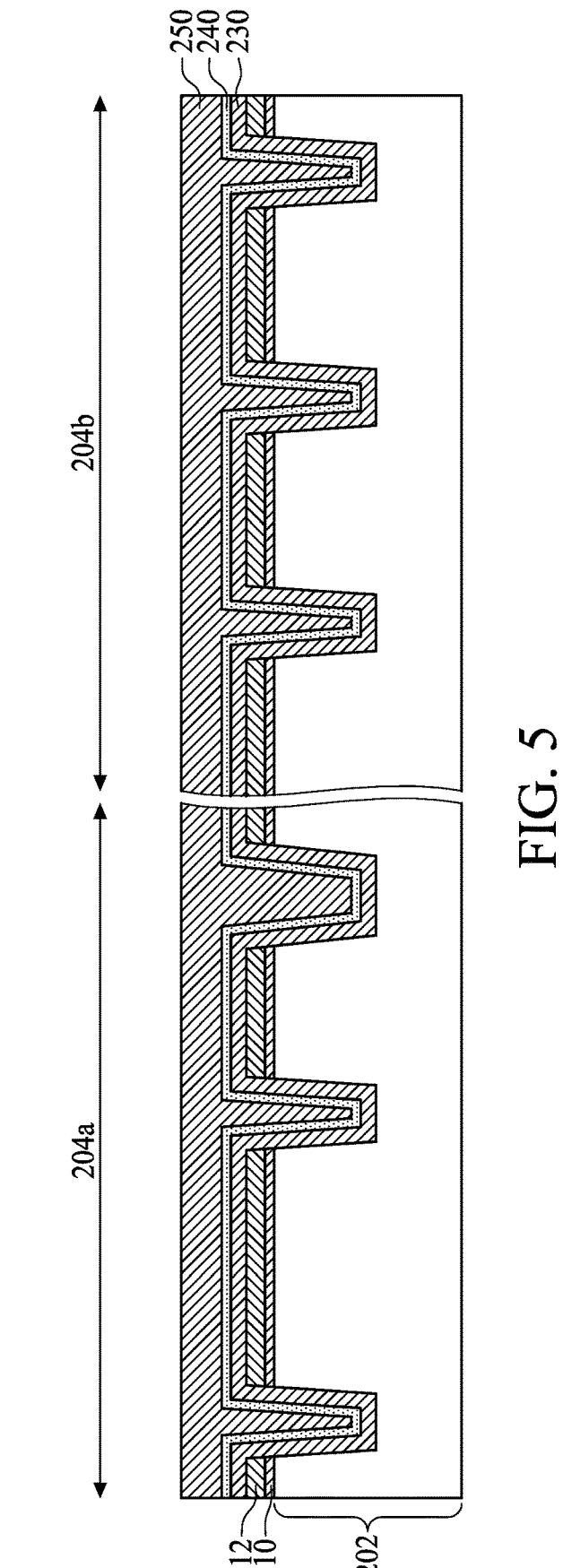

Referring to FIG. 5, in some embodiments, in operation 108, the method 10 includes filling the trenches 220a-1, 220a-2 and 220b with a second insulating layer 250. In some embodiments, the second insulating layer 250 includes a material different from that of the charge-trapping layer 240. In some embodiments, the second insulating layer 250 may include silicon dioxide ($SiO_2$) Therefore, it may be referred to as a second oxide layer 250. However, other suitable insulating materials may be used to form the second insulating layer 250. For example, the second insulating layer 250 may include semiconductor oxides, semiconductor oxynitrides, fluorinated silicate glass (FSG), low-K dielectric materials, or a combination thereof. A thickness of the second insulating layer 250 may be between approximately 3,000 angstroms and approximately 6,000 angstroms, but the disclosure is not limited thereto. The second insulating layer 250 serves as a gap-filling material that fills the trenches 220a-1, 220a-2 and 220b. As shown in FIG. 5, the trenches 220a-1, 220a-2 and 220b are filled with the second insulating layer 250. Further, the second insulating layer 250 covers a top surface of the charge-trapping layer 240. In some embodiments, the second insulating layer 250 may be formed using an HDP-CVD, a sub-atmospheric CVD (SACVD), a high-aspect-ratio process (HARP), a spin-on process, or other suitable operations. In one such embodiment, a CVD process is used to deposit a flowable dielectric material that includes both the material of the second insulating layer 250 and a solvent in a liquid or semiliquid state. A curing process is used to remove the solvent, leaving behind the second insulating layer 250 in a solid state.

Figure 6:
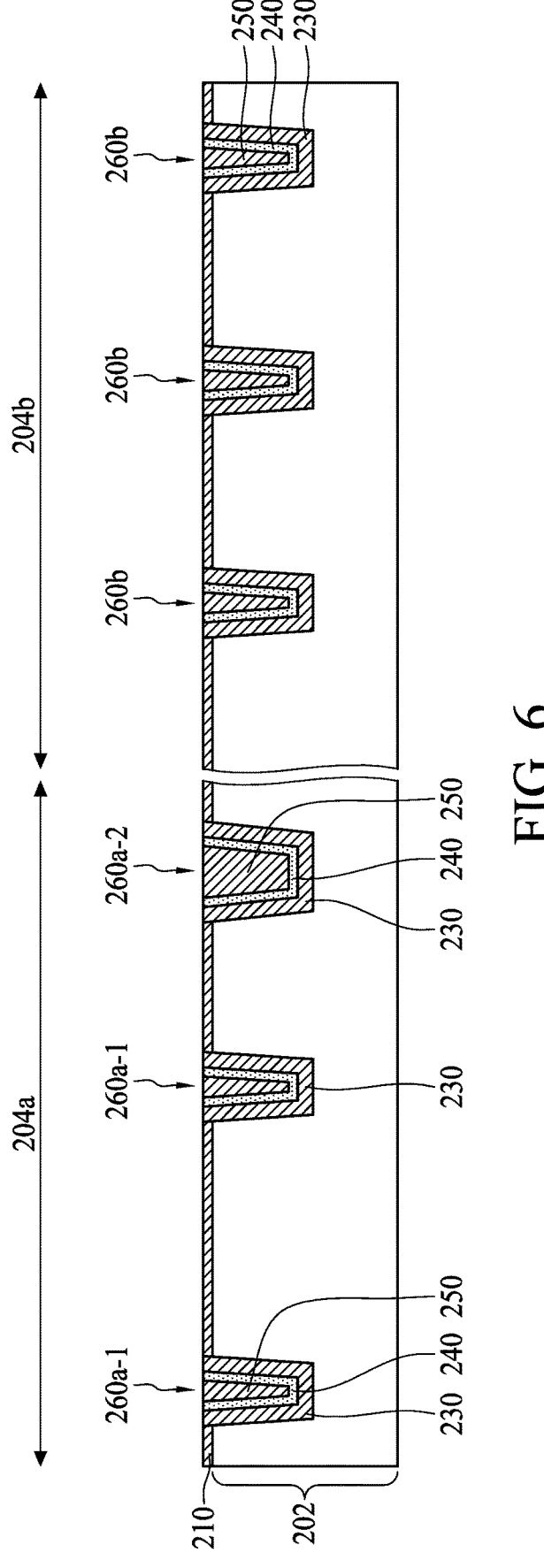

Referring to FIG. 6, a planarization operation such as a chemical mechanical polishing/planarization (CMP) is performed to remove superfluous materials. In some embodiments, the CMP may use the patterned hard mask layer 212 as a CMP stop to prevent planarization of the semiconductor substrate 202. In some embodiments, the CMP completely removes the patterned hard mask layer 212. In such embodiments, the CMP removes a portion of the second insulating layer 250, a portion of the charge-trapping layer 240, a portion of the first insulating layer 230 and the patterned hard mask layer 212, as shown in FIG. 6. In some embodiments, the pad layer 210 remains over the semiconductor substrate 202 after the planarization operation. In other embodiments, the pad layer 210 is removed from the semiconductor substrate 202 after the planarization operation. Accordingly, isolation structures 260a-1 and 260a-2 are formed in the sensor array region 204*a*, and isolation structures 260*b* are formed in the peripheral region 204*b*.

Figure 7:

Referring to FIG. 7, in some embodiments, some front-end-of-line (FEOL) operations may be performed to form pixel image sensors such as photodiodes or pinned layer photodiodes in a diffusion region 270*a*-1, and other diffusion region 270*a*-2 in the sensor array region 204*a*. Further, diffusion regions 270*b*-1 and 270*b*-2 may be formed in the peripheral region 204*b* to form doped wells that may be used, for example, to form a CMOS logic device in the peripheral region 204*b*. In such embodiments, the diffusion region 270*b*-1 and the diffusion region 270*b*-2 may include dopants of complementary types (i.e., p-type dopants and n-type dopants). In some embodiments, the diffusion regions 270*a*-1 and 270*a*-2 may respectively include one or more doped regions as required, though not shown. In some embodiments, the diffusion regions 270*a*-1, 270*a*-2, 270*b*-1 and 270*b*-2 may be formed prior to the forming of the isolation structures 260*a*-1, 260*a*-2 and 260*b*, but the disclosure is not limited thereto.

Still referring to FIG. 7, in some embodiments, FEOL operations may be performed to form a gate structure 272*a* overlaying the diffusion region 270*a*-2 in the sensor array region 204*a*. Further, a gate structure 272*b*-1 is formed overlaying the diffusion region 270*b*-1 and a gate structure 272*b*-2 is formed overlaying the diffusion region 270*b*-2 in the peripheral region 204*b*. The gate structures 272*a*, 272*b*-1 and 272*b*-2 may include a gate conductive layer and a gate dielectric layer. The gate conductive layer may be formed of a doped polysilicon material for example, or may be formed using metal gate operations. The gate dielectric layer may include silicon oxide or high-k gate dielectric material. In some embodiments, FEOL operations may be performed to form lightly-doped drains (LDDs) (not shown) in the diffusion regions 270*b*-1 and 270*b*-2, spacers (not shown) over sidewalls of the gate structures 272*a*, 272*b*-1 and 272*b*-2, and source/drain regions 274*b*-1, 274*b*-2 in the diffusion regions 270*b*-1, 270*b*-2.

In some embodiments, the diffusion region 270*a*-2 and the gate structure 272*a* may form a photodiode transfer transistor, but the disclosure is not limited thereto. The transfer transistor may be used for transferring charge corresponding to the light sensed by the image sensor (i.e., the photodiode formed in the diffusion region 270*a*-1) into a storage node (not shown), for example. In some embodiments, a reset transistor, a source follower transistor, and a read select transistor for each image sensor may be formed in the sensor array region 204*a*. Three-transistor (3T) and four-transistor (4T) pixel circuits, for example, may be formed with the image sensor in the sensor array region 204*a*.

It is known that both front side illumination (FSI) and back side illumination (BSI) image sensors may include the above-mentioned semiconductor structure 200. However, when using an FSI image sensor, the light impinging on a photodiode in the sensor must first pass through the metallization layers and the interlayer dielectric material overlying the front side of the substrate, thereby reducing the light level impinging on the photodiode, lowering the QE, increasing the noise (reducing SNR), and generally reducing performance of the sensor device. BSI image sensors are therefore increasingly used. In some embodiments, the semiconductor structure 200 provided by the present disclosure can be integrated with BSI image sensors. In such embodiments, the light enters the semiconductor substrate 202 from the back side 202B, and the light impinging on the image sensor 270 traverses a relatively thin semiconductor layer without having to traverse any overlying metallization layers or interdielectric layers, in sharp contrast to function of the FSI image sensors. Use of BSI image sensors may therefore increase image sensor performance.

Figure 8:
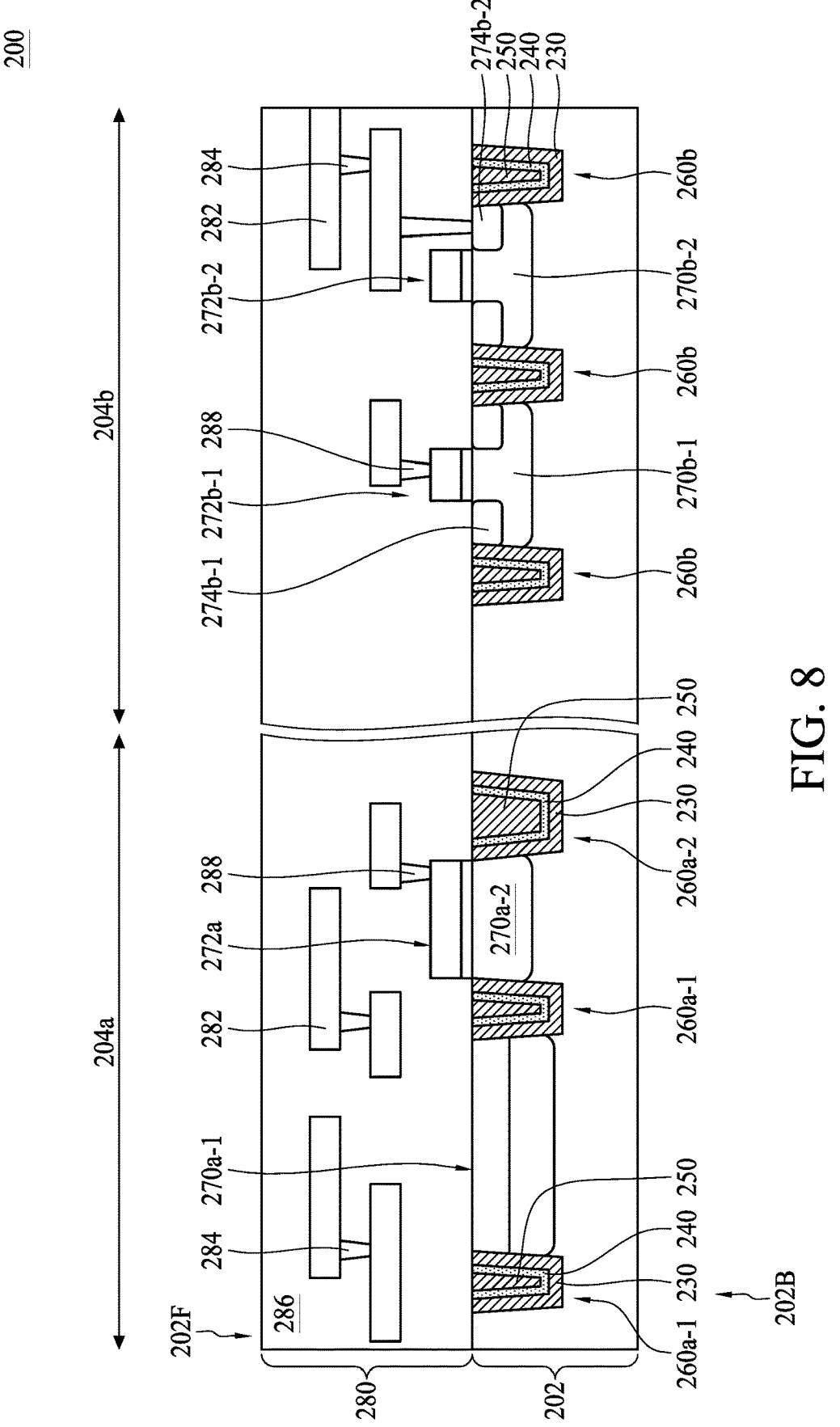

Referring to FIG. 8, in some embodiments, after the forming of the image sensors and the devices (i.e., the transistors shown in FIG. 7), middle-end-of-line (MEOL) and back-end-of-line (BEOL) operations may be performed on a BEOL metallization stack 280 over a front side 202F of the semiconductor substrate 202 and over the devices. The BEOL metallization stack 280 includes a plurality of metallization layers 282 and via structure 284 stacked in an interlayer dielectric (ILD) layer 286. The metallization layers 282 are electrically connected by the via structures 284. Further, contact structures 288 are formed by MEOL operations to electrically connect the BEOL metallization stack 280 to the devices. For example, the metallization layer 282 may be coupled to the gate structure (i.e., the gate structure 272*a*). The metallization layer 282 may be coupled to the source/drain region (i.e., the source/drain region 274*b*-2). The metallization layer 282 may further be coupled to diffusion regions or other structures, though not shown. In some embodiments, the ILD layer 286 can include a low-k dielectric material (i.e., a dielectric material with a dielectric constant less than 3.9) or an oxide, but the disclosure is not limited thereto. The plurality of metallization layers 282 and the via structures 284 may include a metal such as copper (Cu), tungsten (W), or aluminum (Al), but the disclosure is not limited thereto. In some embodiments, another substrate (not shown) can be disposed between the metallization structure 280 and external connectors such as a ball grid array (BGA) (not shown). The semiconductor structure 200 may be electrically connected to other devices or circuits through the external connectors, but the disclosure is not limited thereto.

Referring to FIG. 8, in some embodiments, a semiconductor structure 200 is provided. The semiconductor structure 200 includes a semiconductor substrate 202, and the semiconductor substrate 202 has a sensor array region 204*a* and a peripheral region 204*b* defined thereon. In some embodiments, the sensor array region 204*a* may be surrounded by the peripheral region 204*b*. In other words, the peripheral region 204*b* may have a frame-like configuration surrounding the sensor array region 204*a*, but the disclosure is not limited thereto. A plurality of image sensors and related devices may be formed in the array region 204*a*. Although only one image sensor is shown, those skilled in the art would understand that a width of the image sensors may be equal to or, alternatively, different from each other. Further, the image sensors may be varied from one another to have different junction depths, thicknesses, and so forth. For the sake of simplicity, only one image sensor is illustrated, but it should be understood that any number of radiation-sensing regions may be implemented.

In some embodiments, the image sensors may be arranged in a column-and-row array. In some embodiments, devices for forming circuitry for providing functions other than that of the image sensors, such as input output buffers and logic circuitry may be formed in the peripheral region 204*b*.

In some embodiments, the above-mentioned devices, doped regions of the devices, diffusion regions of the devices, and the regions 204*a*, 204*b* may be isolated from each other by isolation structures. As shown in FIG. 8, the isolation structures 260*a*-1 and 260*a*-2 may be formed in the sensor array region 204*a*, and the isolation structures 260*b* may be formed in the peripheral region 204*b*. In some embodiments, the isolation structures 260*a*-1 or 260*a*-2 may be formed adjacent to the image sensor in the sensor array region 204a. The isolation structures 260a-1 or 260a-2 may be adjacent to the device such as the transfer device in the sensor array region 204a. In some embodiments, the isolation structures 260b may be formed between the devices (i.e., the transistors forming the CMOS device) in order to provide electrical isolation. The isolation structures 260a-1, 260a-2 and 260b may be formed by the above-described method. As mentioned above, the width of the isolation structures 260a-1 in the sensor array region 204a and the width of the isolation structures 260b in the peripheral region 204b may be similar, while the width of the isolation structure 260a-2 in the sensor array region 204a and the width of the isolation structure 260b in the peripheral region 204b may be different, depending on various product requirements. Additionally, depths of the isolation structures 260a-1, 260a-2 and 260b may be similar, but the disclosure is not limited thereto.

Each of the isolation structures 260a-1, 260a-2 in the sensor array region 204a and each of the isolation structures 260b in the peripheral region 204b may include same elements: the first insulating layer 230, the second insulating layer 250 and the charge-trapping layer 240 between the first insulating layer 230 and the second insulating layer 250. Further, the first insulating layers 230 of the isolation structures 260a-1 and 260a-2 are in contact with the semiconductor substrate 202. Similarly, the first insulating layers 230 of the isolation structures 260b are in contact with the semiconductor substrate 202. Accordingly, the charge-trapping layers 240 are separated from the semiconductor substrate 202 by the first insulating layers 230.

The first insulating layers 230 of the isolation structures 260a-1, 260a-2 and the first insulating layers of the isolation structures 260b include similar materials. As mentioned above, the first insulating layers 230 of the isolation structures 260a-1, 260a-2 and 260b may include oxide, but the disclosure is not limited thereto. The second insulating layers 250 of the isolation structures 260a-1, 260a-2 and the second insulating layers 250 of the isolation structures 260b include similar materials. As mentioned above, the second insulating layers 250 of the isolation structures 260a-1, 260a-2 and 260b may include oxide, but the disclosure is not limited thereto. In some embodiments, the first insulating layers 230 and the second insulating layers 250 may include similar materials. In some alternative embodiments, the first insulating layers 230 and the second insulating layers 250 may include different materials. The charge-trapping layers 240 of the isolation structures 260a-1, 260a-2 and the charge-trapping layers 240 of the isolation structures 260b include similar materials. Further, the charge-trapping layers 240 include the material different from those of the first insulating layers 230 and the second insulating layers 250. For example, the charge-trapping layers 240 may include silicon nitride, but the disclosure is not limited thereto.

In some embodiments, a thickness of the first insulating layers 230 of the isolation structures 260a-1, 260a-2 and a thickness of the first insulating layers 230 of the isolation structures 260b may be similar, but the disclosure is not limited thereto. In some embodiments, a thickness of the second insulating layers 250 of the isolation structures 260a-1, 260a-2 and a thickness of the second insulating layers 250 of the isolation structures 260b may be similar, but the disclosure is not limited thereto. The charge-trapping layer 240 of the isolation structures 260a-1, 260a-2 and the charge-trapping layer 240 of the isolation structures 246b include similar materials. Thicknesses of the charge-trapping layers 240 of the isolation structures 260a-1, 260a-2 and 260b are similar. The thicknesses of the charge-trapping layers 240 are less than the thicknesses of the first insulating layers 230, and the thicknesses of the first insulating layers 230 are less than the thicknesses of the second insulating layers 250.

Figure 9:
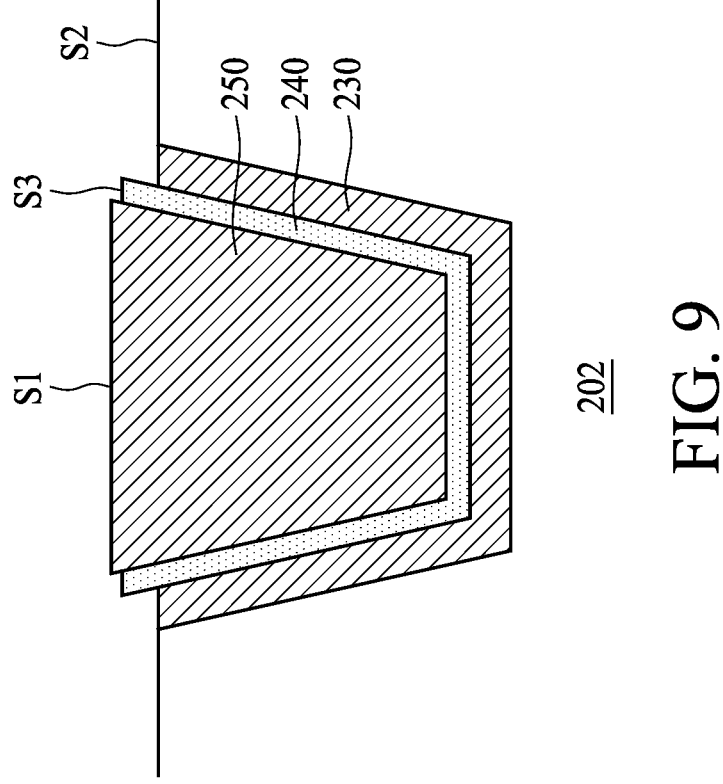
FIG. 9 is an enlarged view of an isolation structure according to aspects of the present disclosure in one or more embodiments.

Please refer to FIG. 9, which is an enlarged view of one of the isolation structures 260a-1, 260a-2 and 260b. In some embodiments, a top surface S1 of the second insulating layer 250 is at a level higher than a top surface S2 of the semiconductor substrate 202. In some embodiments, a top surface S3 of a topmost portion of the charge-trapping layer 240 is at a level higher than the top surface S2 of the semiconductor substrate 202. Further, the top surface S3 of the topmost portion of the charge-tapping layer 240 is at a level between the top surface S1 of the second insulating layer 250 and the top surface S2 of the semiconductor substrate 202.

Figure 10A:
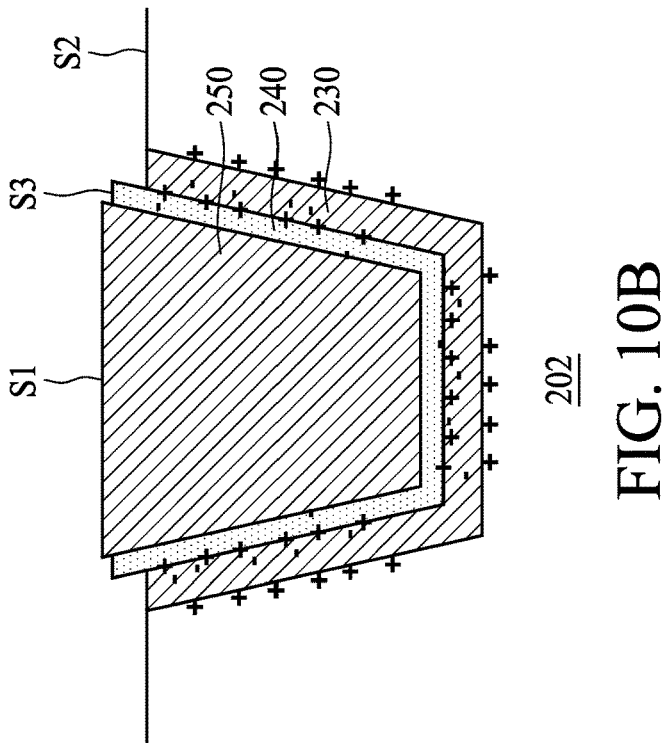
FIGS. 10A and 10B are schematic drawings illustrating an isolation structure in a semiconductor structure according to aspects of the present disclosure in one or more embodiments.

Referring to FIG. 10A, in some embodiments, the charge-trapping layer 240 includes silicon nitride, which includes positive fixed charges. Further, the positive fixed charges cause the silicon nitride to have a trapping property that allows the charge-trapping layer 240 to trap carriers.

Recent down-scaling of CMOS image sensors (CIS s) has reduced pixel pitch (i.e., the distance between the image sensors) to sub-micrometer levels (e.g., less than 0.75 micrometers). At such levels, the isolation structures between the image sensors are of great importance for proper operation. In some embodiments, the image sensor (i.e., the photodiode) may generate electrons in response to the incident light. However, in some comparative approaches, the isolation structure is not able to prevent leakage current between neighboring images sensors, resulting in cross talk between neighboring image sensors. If the leakage current is above a particular level, the image sensor may falsely detect light when it detect none. In this situation, the leakage current is referred to as a dark current. Further, a junction exists between the isolation structure and the regions to be isolated from each other, whereby the junction may cause breakdown voltage and/or latch-up concerns.

Figure 10B:
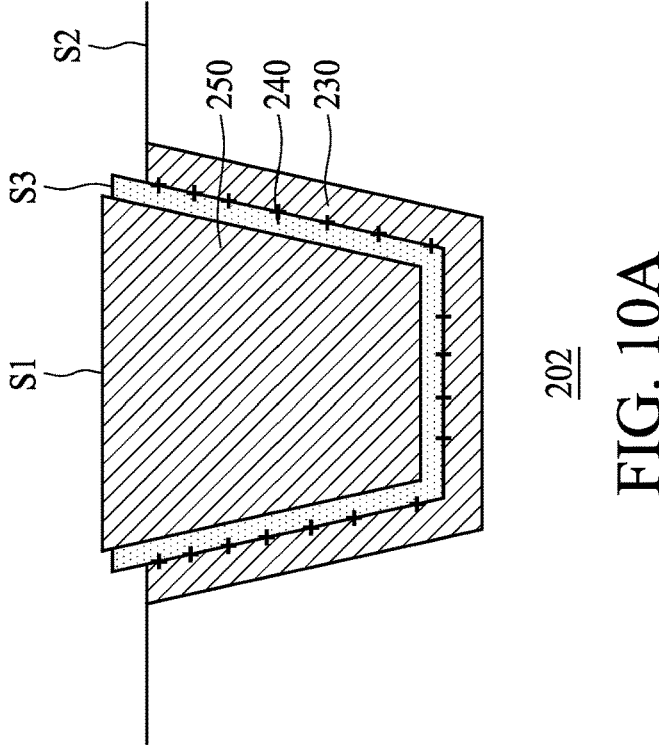

As mentioned above, the charge-trapping layer 240 (i.e., the silicon nitride layer) include positive fixed charges. The fixed charges may combine with electrons and thus the electrons from the semiconductor substrate 202 are trapped in the charge-trapping layer 240 in the sensor array region 204a, as shown in FIG. 10B. Such trapping is found even though the charge-trapping layer 240 is separated from the semiconductor substrate 202 by the first insulating layer 230. Accordingly, the leakage issue and the noise issue in the sensor array region 204a are mitigated. Similarly, in the peripheral region 204b, electrons from the semiconductor substrate 202 may be trapped in the charge-trapping layer 240 of the isolation structure 260b, and thus the leakage issue in the peripheral region 204b may also be mitigated.

As mentioned above, in some comparative approaches, a doped region may be formed to mitigate the leakage and noise issue in the sensor array region 204a. Such doped region requires a photolithography operation and ion implantation that may increase process cost and cause substrate damage. In contrast with the comparative approaches, the present disclosure therefore provides a method for manufacturing a semiconductor structure including isolation structures that are able to mitigate the above mentioned issues.

Accordingly, the present disclosure provides a method for forming an isolation structure that is able to reduce the need to use of the protecting mask and perform the photolithography operation. Further, the method replaces the doped region with a charge-trapping layer, thereby eliminating the need to perform the ion implantation used to form the doped region, such that the defect issue and the leakage issue caused by the ion implantation can be mitigated.

In some embodiments, a method for forming an isolation structure is provided. The method includes following operations. A trench is formed in a semiconductor substrate. A first insulating layer covering a bottom and sidewalls of the trench is formed. A charge-trapping layer is formed on the first insulating layer. The trench is filled with a second insulating layer. The charge-trapping layer include a material different from those of the first insulating layer and the second insulating layer.

In some embodiments, a method for forming an isolation structure is provided. The method includes following operations. A first trench and a second trench are formed in a semiconductor substrate. A width of the first trench is less than a width of the second trench. A first insulating layer is formed to cover a bottom and sidewalls of each of the first trench and the second trench. A charge-trapping layer is formed on the first insulating layer. The first trench and the second trench are filled with a second insulating layer. The charge-trapping layer include a material different from those of the first insulating layer and the second insulating layer. Portions of the second insulating layer are removed to form a first isolation structure and a second isolation structure. A first diffusion region is formed adjacent to the first isolation structure, and a second diffusion region is formed adjacent to the second isolation structure. The first isolation structure is between the first diffusion region and the second diffusion region. The first isolation structure separates the first diffusion region and the second diffusion region from each other.

In some embodiments, a method for forming an isolation structure is provided. The method includes following operations. A substrate is received. The substrate has a sensor array region and a peripheral region. A first trench is formed in the sensor array region, and a second trench is formed in the peripheral region. A first insulating layer is formed to cover a bottom and sidewalls of each of the first trench and the second trench. A charge-trapping layer is formed on the first insulating layer. The first trench and the second trench are filled with a second insulating layer. The charge-trapping layer include a material different from those of the first insulating layer and the second insulating layer. Portions of the second insulating layer are removed to form a first isolation structure in the sensor array region and a second isolation structure in the peripheral region. A pixel image sensor is formed in the sensor array region, and a logic device is formed in the peripheral region. The pixel image sensor is adjacent to the first isolation structure, and the logic device is adjacent to the second isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an isolation structure, comprising:

forming a trench in a semiconductor substrate;

forming a first insulating layer covering a bottom and sidewalls of the trench;

forming a charge-trapping layer on the first insulating layer; and filling the trench with a second insulating layer, wherein the charge-trapping layer comprises a material different from those of the first insulating layer and the second insulating layer, wherein a surface of a topmost portion of the first insulating layer is leveled with a top surface of the semiconductor substrate to form a first surface, a surface of a topmost portion of the charge-trapping layer is higher than the first surface to form a second surface, and a top surface of the second insulating layer is higher than the first surface and higher than the second surface, wherein a first step height is formed by the first surface and the second surface, and a second step height is formed by the second surface and the top surface of the second insulting layer.

2. The method of claim 1, wherein the forming of the trench further comprises etching the semiconductor substrate through a patterned hard mask layer and a pad layer.

3. The method of claim 2, wherein the first insulating layer further covers a top surface of the patterned hard mask layer.

4. The method of claim 2, wherein a top surface of the patterned hard mask layer is free of the first insulating layer.

5. The method of claim 2, further comprising removing a portion of the second insulating layer, a portion of the charge-trapping layer, a portion of the first insulating layer, and the patterned hard mask layer.

6. The method of claim 1, wherein a top surface of a topmost portion of the charge-trapping layer is at a level between a top surface of the second insulating layer and a top surface of the semiconductor substrate.

7. The method of claim 1, wherein the charge-trapping layer comprises positive fixed charges.

8. The method of claim 7, wherein the charge-trapping layer comprises silicon nitride.

9. A method for forming a semiconductor structure, comprising:

forming a first trench and a second trench in a semiconductor substrate, wherein a width of the first trench is less than a width of the second trench;

forming a first insulating layer covering bottoms and sidewalls of each of the first trench and second trench;

forming a charge-trapping layer on the first insulating layer;

filling the first trench and a second trench with a second insulating layer;

removing portions of the second insulating layer to form a first isolation structure and a second isolation structure;

forming a first diffusion region adjacent to the first isolation structure and forming a second diffusion region adjacent to the second isolation structure, wherein the first isolation structure is between the first diffusion region and the second diffusion region, and separating the first diffusion region and the second diffusion region from each other; and forming a gate structure over the second diffusion region, wherein the charge-trapping layer comprises a material different from those of the first insulating layer and the second insulating layer, wherein a top surface of a topmost portion of the charge-trapping layer is at a level between a top surface of the second insulating layer and a top surface of the semiconductor substrate.

10. The method of claim 9, wherein the forming of the first trench and the second trench further comprises etching the semiconductor substrate through a patterned hard mask layer and a pad layer.

11. The method of claim 10, wherein the first insulating layer further covers a top surface of the patterned hard mask layer.

12. The method of claim 10, wherein a top surface of the patterned hard mask layer is free of the first insulating layer.

13. The method of claim 10, further comprising removing a portion of the second insulating layer, a portion of the charge-trapping layer, a portion of the first insulating layer, and the patterned hard mask layer.

14. The method of claim 9, wherein the charge-trapping layer comprises positive fixed charges.

15. The method of claim 9, wherein the charge-trapping layer comprises silicon nitride.

16. A method for forming a semiconductor structure, comprising:

receiving a semiconductor substrate having a sensor array region and a peripheral region;

forming a first trench in the sensor array region and a second trench in the peripheral region;

forming a first insulating layer covering a bottom and sidewalls of each of the first trench and second trench;

forming a charge-trapping layer on the first insulating layer;

filling the first trench and a second trench with a second insulating layer;

removing portion of the second insulating layer to form a first isolation structure in the sensor array region and a second isolation structure in the peripheral region; and forming a pixel image sensor in the sensor array region and forming a logic device in the peripheral region, wherein the pixel image sensor is adjacent to the first isolation structure, and the logic device is adjacent to the second isolation structure, wherein the charge-trapping layer comprises a material different from those of the first insulating layer and the second insulating layer, wherein a top surface of a topmost portion of the charge-trapping layer is at a level between a top surface of the second insulating layer and a top surface of the semiconductor substrate.

17. The method of claim 16, wherein the charge-trapping layer comprises positive fixed charges.

* * * * *